(12) United States Patent
Hunter et al.

(10) Patent No.: US 9,407,250 B2
(45) Date of Patent: Aug. 2, 2016

(54) SYSTEMS FOR ACCURATE MULTIPLEXING

(75) Inventors: Bradford Lawrence Hunter, Austin, TX (US); Richard David Nicholson, Austin, TX (US); Wallace Edward Matthews, Austin, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 32 days.

(21) Appl. No.: 12/700,895

(22) Filed: Feb. 5, 2010

(65) Prior Publication Data

US 2011/0089992 A1    Apr. 21, 2011

Related U.S. Application Data

(60) Provisional application No. 61/251,814, filed on Oct. 15, 2009.

(51) Int. Cl.
*H03K 17/00* (2006.01)
*H03K 3/01* (2006.01)

(52) U.S. Cl.
CPC .................................. *H03K 17/007* (2013.01)

(58) Field of Classification Search
CPC . H03K 17/002; H03K 17/007; H03K 17/693; H03K 17/735
USPC ......... 327/403, 404, 407, 408, 415, 416, 534; 326/105, 106, 113
See application file for complete search history.

(56) References Cited

U.S. PATENT DOCUMENTS

| | | | | |
|---|---|---|---|---|
| 4,672,246 A * | 6/1987 | Donovan | ....................... | 327/436 |
| 5,598,041 A * | 1/1997 | Willis | .............................. | 307/43 |
| 5,783,957 A * | 7/1998 | Yamauchi | ........................ | 327/53 |
| 5,789,781 A * | 8/1998 | McKitterick | ................. | 257/347 |
| 5,880,620 A * | 3/1999 | Gitlin et al. | .................... | 327/534 |
| 7,728,750 B2 * | 6/2010 | Wang et al. | .................... | 341/153 |
| 7,940,111 B2 * | 5/2011 | Soltanian et al. | ............ | 327/403 |
| 2009/0267679 A1 * | 10/2009 | Azuma | ........................ | 327/408 |
| 2010/0141822 A1 * | 6/2010 | Xue | .............................. | 348/332 |
| 2010/0301398 A1 * | 12/2010 | Rothberg et al. | ............ | 257/253 |

* cited by examiner

*Primary Examiner* — Lincoln Donovan
*Assistant Examiner* — Colleen O Toole
(74) *Attorney, Agent, or Firm* — Andrew Viger; Frank D. Cimino

(57) ABSTRACT

The disclosure presented herein provides example embodiments of systems for accurate multiplexing. The systems and methods presented may be suitable for non-limiting examples of analog to digital conversion with a switched input voltage (for a switched capacitor application) or any circuit with high voltage/high accuracy voltage multiplexing. In an example embodiment, pulsed current sources may be implemented to rapidly turn on and turn off the selected and unselected multiplexer ports while maintaining relatively low power consumption. A Kelvin input port may allow a high voltage input to be accurately sensed by avoiding a voltage drop associated with a selected pass gate p-channel FET channel resistance and parasitic wire resistance. The Kelvin input port biases the gate of a pass FET structure whose body terminals are allowed to remain floating.

9 Claims, 5 Drawing Sheets

SYSTEMS FOR ACCURATE MULTIPLEXING

CROSS-REFERENCE TO RELATED APPLICATION

This application claims priority to U.S. provisional patent application Ser. No. 61/251,814, filed on Oct. 15, 2009, which is incorporated by reference herein.

TECHNICAL FIELD

The present disclosure is generally related to electronics and, more particularly, is related to multiplexing.

BACKGROUND

A multiplexer or mux is a device that performs multiplexing; it selects one of many analog or digital input signals and forwards the selected input into a single line. A multiplexer of 2n inputs has n select lines, which are used to select which input line to send to the output. An electronic multiplexer makes it possible for several signals to share one device or resource, for example, one analog to digital converter or one communication line, instead of having one device per input signal. On the other end, a demultiplexer (or demux) is a device taking a single input signal and selecting one of many data-output-lines, which is connected to the single input. A multiplexer is often used with a complementary demultiplexer on the receiving end.

An electronic multiplexer may be considered as a multiple-input, single-output switch, and a demultiplexer as a single-input, multiple-output switch. The schematic symbol for a multiplexer is an isosceles trapezoid with the longer parallel side containing the input pins and the short parallel side containing the output pin.

FIG. 1 provides a schematic of multiplexer channel 100 as known in the prior art. Multiplexer channel includes input 110, pass transistor 120, p-channel selection transistor 140, n-channel selection transistor 150, selection line 160, and output 170. When select line 160 is pulled high, transistor 150 turns on and transistor 140 turns off. This pulls the gate of transistor 120 down to Vss, turning on transistor 120, which passes input 110 to output 170. There is a need for a high voltage tolerant multiplexing device without a reduction in accuracy.

SUMMARY

Example embodiments of the present disclosure provide systems of accurate multiplexing. Briefly described, in architecture, one example embodiment of the system, among others, can be implemented as follows: a first plurality of body connected transistors configured with electrically connected gate terminals and source terminals, the transistor bodies electrically connected to a first side of a load, the gate terminals electrically connected to a second side of the load, a first drain of the first plurality of the body connected transistors electrically connected to an input voltage, a second drain of the first plurality of body connected transistors electrically connected to a first output; a second plurality of body connected transistors configured with electrically connected gate terminals and source terminals, the transistor bodies configured to be floating, the gate terminals electrically connected to the second side of the load, a first drain of the second plurality of body connected transistors connected to the input voltage, a second drain of the second plurality of body connected transistors electrically connected to a second output; and a selector configured to turn on the second plurality of body connected transistors.

Embodiments of the present disclosure can also be viewed as providing devices configured to provide accurate multiplexing. In this regard, one embodiment of such a device, among others, can be broadly summarized by the following: a first set of body connected pass transistors configured with floating body terminals; a second set of body connected transistors configured to provide a bias voltage for the first set of body connected pass transistors; and a load configured to provide a turn-off voltage for the first set of body connected pass transistors.

DETAILED DESCRIPTION

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Analog high voltages are often multiplexed for selection and data sampling purposes. On-chip high voltage signal selections often require special asymmetric field effect transistors (FETs) with high voltage tolerance restricted to the drain net (with respect to all other terminals). Combining speed and accuracy in a high voltage multiplexer circuit topology while maintaining reliable operation and low power consumption may be difficult. The disclosure provided herein may provide means to select and sample multiple high voltage signals with high accuracy, high speed, and low power consumption.

In an example embodiment, pulsed current sources may be implemented to rapidly turn on and turn off the selected and unselected multiplexer ports while maintaining relatively low power consumption. A Kelvin input port may allow a high voltage input to be accurately sensed by avoiding a voltage drop associated with a selected pass gate p-channel FET (pFET) channel resistance and parasitic wire resistance. The parasitic pFET channel and wire resistance may create a voltage drop because a pull-down current source biases the pFET gate in an on state. The disclosure presented herein provides example embodiments of systems for accurate multiplexing. The systems and methods presented may be suitable for non-limiting examples of analog to digital conversion with a switched input voltage (for a switched capacitor application) or any circuit with high voltage/high accuracy voltage multiplexing.

Figure 2:
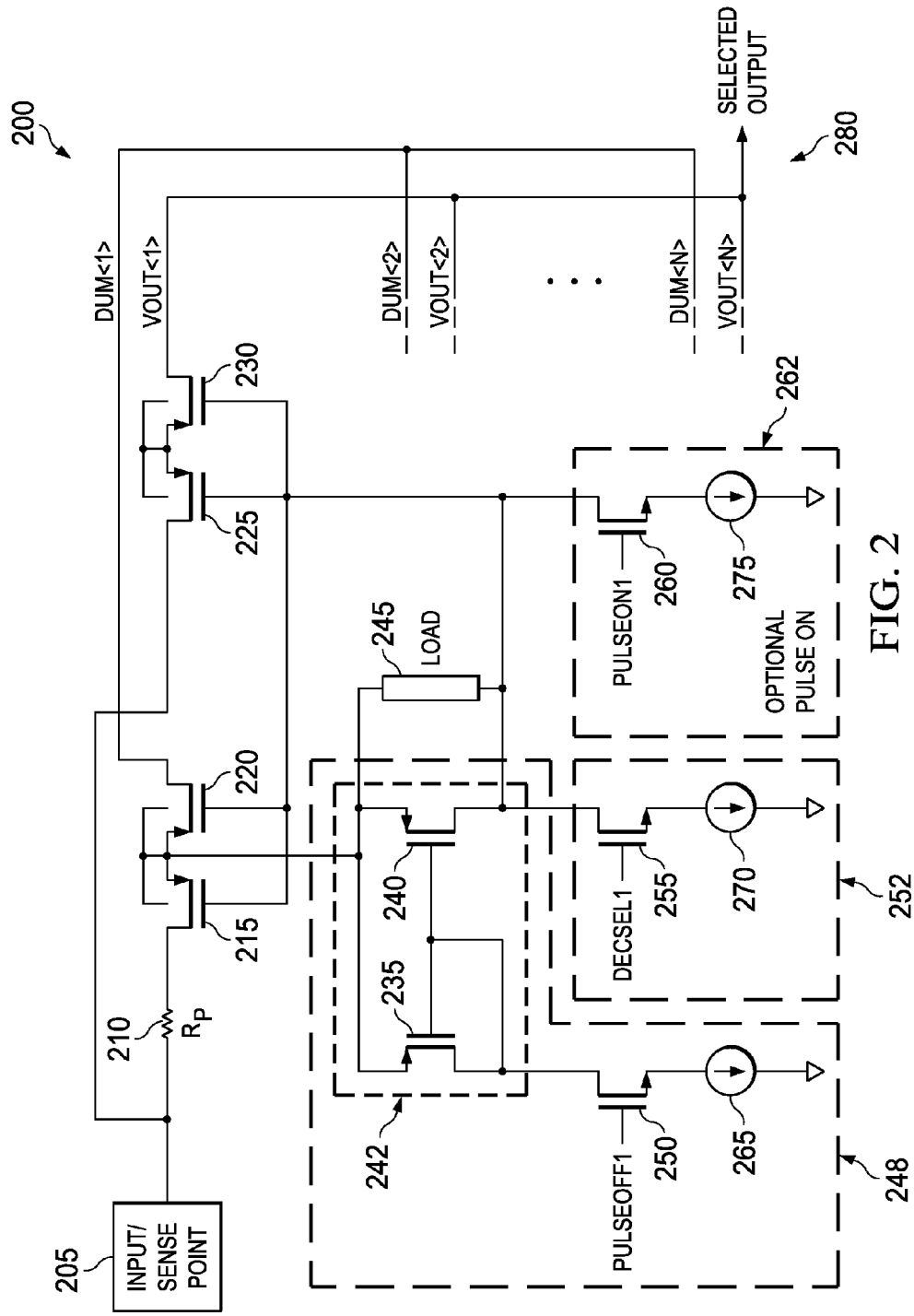
FIG. 2 is a circuit diagram of an example embodiment of an accurate multiplexer channel.

FIG. 2 provides an example embodiment of systems for accurate multiplexing. Multiplexing channel200 includes input 205 and output 280. The output pass path includes pass transistor 225 and pass transistor 230. Pass transistors 225 and 230 are shown as p-channel field effect transistors (PETs), but they could ben-channel PETs with reverse polarity gate signals in alternative embodiments. Other alternative embodiments may include other technologies, including, but not limited to bipolar, biFET, GaAs, and CMOS. The source terminals, gate terminals and body terminals of pass transistors 225 and 230 are tied together and the bodies are floating. A dummy output path includes parasitic resistance 210, dummy pass transistor 215, and dummy pass transistor 220. The gates, sources and bodies of dummy pass transistors 215 and 220 are tied together and the bodies are connected to the top of load structure 245. Selection structure 252 is electrically connected to the bottom of load structure 245.

An alternative embodiment includes pulse-off structure 248. In an example embodiment, pulse-off structure 248 includes current mirror structure 242. Current mirror 242 includes p-channel FETS 235 and 240. An example embodiment of pulse-off structure 248 also may include n-channel FET 250 and current source 265. An alternative embodiment includes pulse-on structure 262. Pulse-on structure 262 includes n-channel FET 260 and current source 275.

Pass transistor pair 215 and 220 and pair 225 and 230 may be implemented with asymmetric transistors. The asymmetric transistor may be fabricated with a different gate oxide thickness (generally thicker) from a different channel doping (generally lower). Both transistors 215 and 220 may be individually asymmetric. Each device individually may have a drain region of the channel that is lightly doped with a thick oxide to allow the high drain voltage to be safely dropped across the tolerant portion of the channel without damaging the thin oxide high doped region of the channel. Because the pass device is effectively composed of two back to back asymmetric devices (215 and 220) with the drain regions oriented outward, the effective pass device becomes symmetrically high voltage tolerant.

On one transistor of each pair, the gate to drain voltage may be much higher. The drain to source voltage may be much higher because the doping in the channel in that region is much lower and the channel is substantially long and wide. Each transistor pair may have a high drain to source voltage. In an example embodiment, there may not be a high source to drain voltage nor a high gate to source voltage. There may also not be a high gate to body voltage nor a high body to source voltage. In this example embodiment, only the drain voltage may be high for the n-channel devices. In a p-channel device, the body, the gate, and the source may be high and the drain may be low.

There is a benefit derived from a pass gate structure that passes an analog voltage when the voltage is selected using asymmetric transistors. The device may be constructed at a lower cost. It also has the advantage of obtaining the performance and size benefits of a thinner oxide device (with a higher channel doping) while simultaneously offering high voltage support. Modern analog CMOS processes with small device geometries often only offer high voltage support via asymmetric transistors (for both cost and performance reasons).

Additionally, current sources 265, 270, and 275 may be implemented with a standard current mirror. Load structure 245 may be implemented with any pull-up mode structure such as a depletion mode transistor or a resistive load, either of which may be in parallel with a clamping device such as a zener diode. Load 245 may be implemented with a structure that performs a weak pull up function. The clamping device may be a protection circuit to protect the gate oxides from overvoltage. When inputs may be chosen from voltages ranging from 1V, 20V, and 40V, for example, there may be 40V across the device. So the input structure may be subjected to 20V and −20V from drain to source.

To enable the input structure to handle this range, the drain terminals and source terminals are electrically connected back to back. Additionally, the current may be directed through the connected transistor bodies. In a low voltage 5V circuit, everything may be tied to 5V. However, in a higher voltage circuit in which the input voltage range is higher than the breakdown voltage of the gate oxide layers of the transistors, if the bodies of the transistors in this back to back configuration are subjected to 40V, the transistor may be damaged. If the bodies were tied to the inputs, the body diodes would be a forward biased. To avoid this, the bodies may be tied together in the center, the two drain extended regions (the high asymmetric regions) are located on the outside of the structure, and the bodies are controlled as provided herein. The input voltage may be dynamic. The input voltage can range from 0 to Vmax. There is no limitation to the voltages applied to the pins. Any of the input voltages can be applied to any input pin without limitation.

Figure 6:
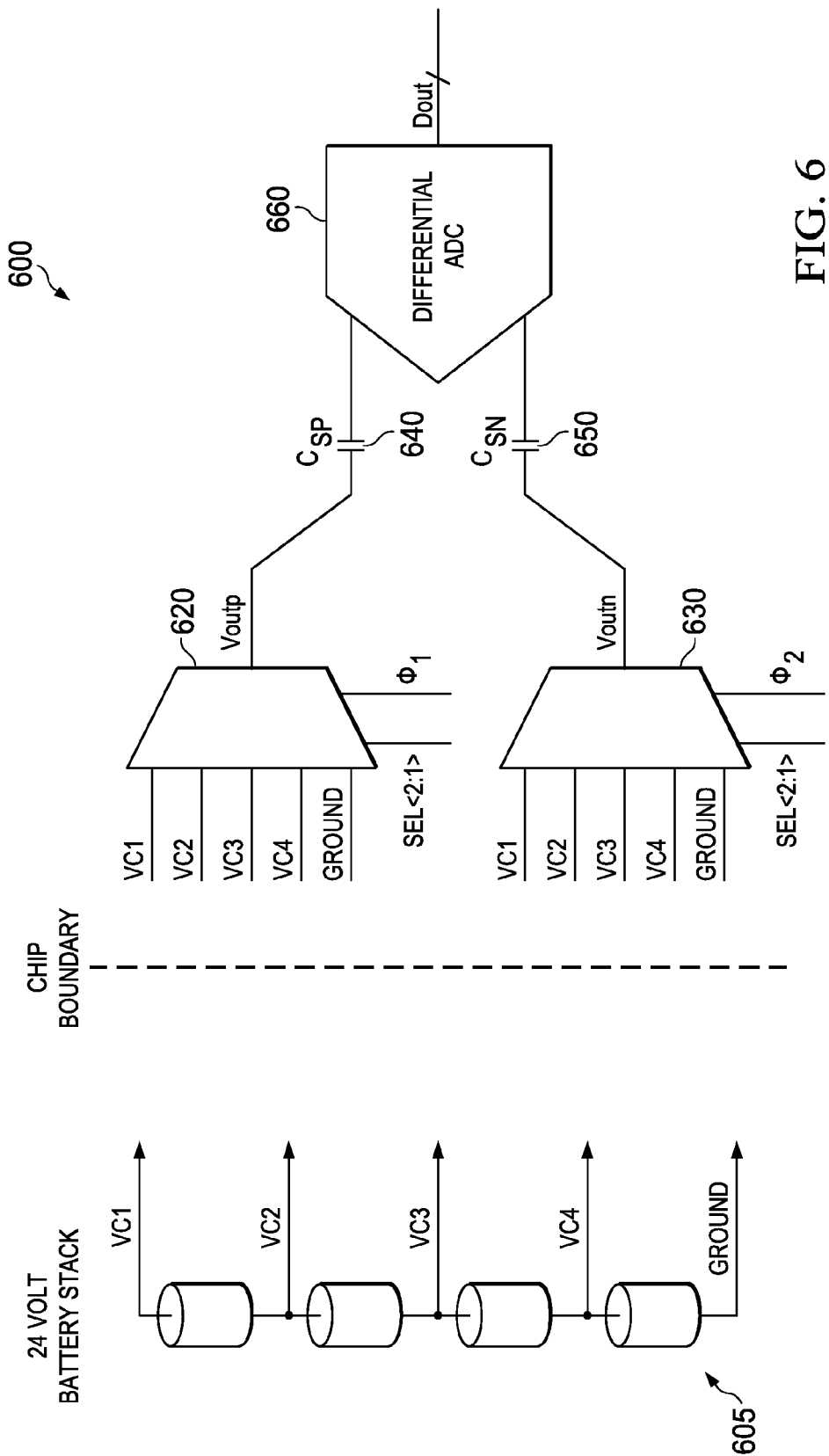
FIG. 6 is a block diagram of an example embodiment of an analog to digital converter using the multiplexer of FIG. 2.

Transistors 215 and 220 may be used to set up a gate voltage bias to drive transistors 225 and 230, so that no current needs to pass through the channels of transistors 225 and 230. The bodies are left floating. For this reason, there's no voltage drop due to a parasitic resistance through transistors 225 and 230. Therefore, there is no offset error because there is no current through the bodies of the transistors 225 and 230 when the load is capacitive. If there was a resistive load on VOUT, then the current may be supplied through the channels of transistors 225 and 230. However, FIG. 6 shows an example application in which the output load is purely capacitive. Hence VOUT should settle to the input voltage with no DC current flowing through transistors 225 and 230. This situation may change if the load were resistive.

Without transistors 215 and 220, there is no pull-up mechanism to turn off the gate of transistors 225 and 230. The clamp mechanism of load 245 may be configured to clamp at a protection voltage that is lower than the $V_{GS}$ maximum voltage of transistors 215, 220, 225, and 230. So, when load 245 clamps, load 245 clamps the bodies and gate terminals of transistors 215, 220, 225, and 230 to the $V_{GS}$ maximum voltage.

Transistors 225 and 230 are the pass transistors that effectively pass input 205 to output 280. If DECSEL1 comes on it will turn on transistors 215, 220, 225, and 230 and input 205 will be passed to the dummy output and to VOUT. VOUT is the voltage that eventually is sent to the output and the dummy output is a dummy voltage which is not connected to an output in this example embodiment. In an alternative embodiment, the dummy voltage may be presented as an alternative output. For instance, in a de-multiplexer application, the dummy voltage would be presented. The gate and the body of transistors 215, 220, 225, and 230 should preferably remain within the safe operating region of the devices. Load 245 should preferably contain a clamping mechanism.

When DECSEL1 is turned on, if the voltage approaches the maximum gate to source breakdown voltage of transistors 215, 220, 225, and 230, the load is configured to clamp, for example, with a zener diode clamp, so the gate oxides of transistors 215, 220, 225, and 230 are not affected. When DECSEL1 is turned on, transistor 255 will pull the gate voltage of transistors 215, 220, 225, and 230 down to the input voltage minus the clamp voltage. It will pull down across the load until the load clamps. The path for the current is from the input voltage across the resistor 210 through the channel of transistor 215 down through load 245, down through transistor 255 and current source 270.

Current may be pulled through the channels of the dummy transistors which creates an offset error in the dummy output line. For example, if 100 micro amps is pulled across 1000 ohm resistor an offset error of 100 millivolts is generated. So, pulling the current through the body creates an offset error in the dummy line. This function provides protection for the device because the body voltage gets pinned at a diode below the input voltage plus the zener clamp.

The resistance of load 245 may be configured to be relatively small so that the equalization across the load is relatively fast. However, when DECSEL1 is turned on and the bottom of the load is pulled low, current source 270 must be strong. In an alternative embodiment, to keep the circuit low power, current source 270 may be configured to be relatively weak, enough to keep the load equalized. This would cause the initial equalization across load 245 to be relatively slow, however. Pulse-off structure 248 may be configured to make the equalization fast by pulling more current across the load. The PULSEOFF1 signal may be configured to pulse on transistor 250 to generate a relatively quick pulse (for example, at the rising edge of a clock) to pulse the circuit off. Current source 265 may be configured to be relatively high, current source 270 for DECSEL1 may be configured to be relatively small, and the resistance of load 245 may be configured to be relatively large to turn on with very little current. So, when DECSEL1 is turned off, the pull up across load 245 is relatively slow because the resistor is large. To get around that, the PULSEOFF1 signal turns on transistor 250, which quickly shorts out load 245 for a short amount of time to equalize the $V_{GS}$ of transistors 215, 220, 225, and 230.

Transistor 250 will be inactive when PULSEOFF1 is at ground. If PULSEOFF1 is low there is no current going into current mirror 242 comprising transistors 235 and 240. Since transistor 240 is off, there is no current in current mirror 242. The load effectively equalizes the voltage across load 245 when there is no current flowing through current sources 265 or 270. So, the pull up of load 245 allows the gate voltage of transistors 215, 220, 225, and 230 which is connected to the bottom of the load to equalize with the body voltage of transistors 215 and 220. Current mirror 242 could be implemented with any mirroring structure. In an example embodiment, the bodies of transistor 235 and transistor 240 in the current mirror may be tied to their source terminals. Also, in an example embodiment, the bodies of transistor 250, transistor 255, and transistor 260 may be tied to ground.

In an example embodiment, pulse-on section 262 may operate the switching of multiplexer channel 200 at higher speed. PULSEON1 pulses on at higher current to quickly pulse the $V_{GS}$ of transistors 215, 220, 225, and 230 on through the load. Load 245 clamps, so pulse-on section 262 doesn't pull the gated of transistors 215, 220, 225, and 230 all the way to ground. The PULSEON turns it on quickly and then goes away, but the DECSEL1 is still present and it is strong enough to keep transistors 215, 220, 225, and 230 turned on.

Figure 1:
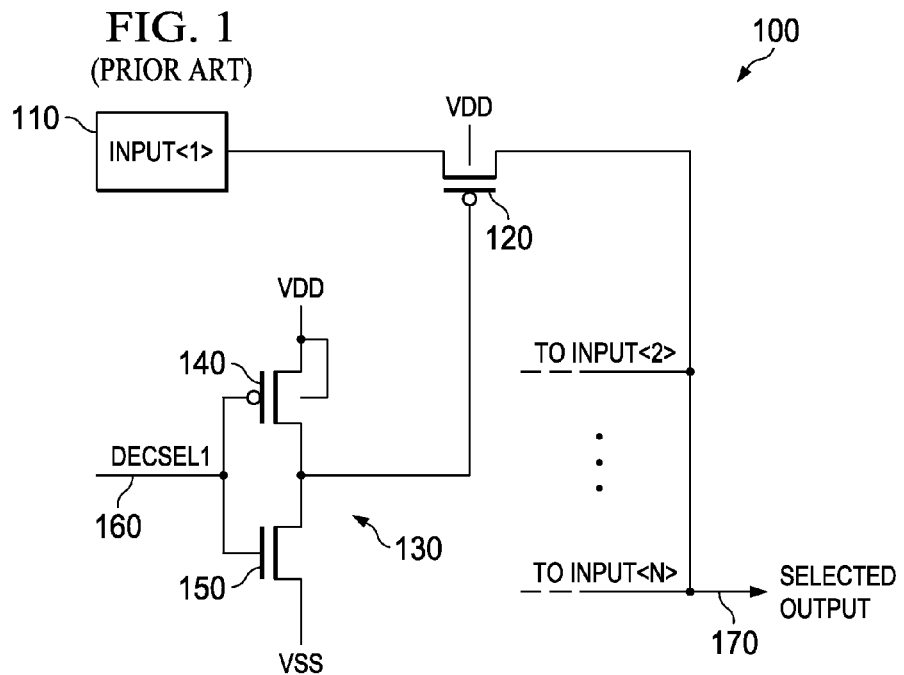
FIG. 1 is a circuit diagram of an example embodiment of a multiplexer channel.
Figure 3:
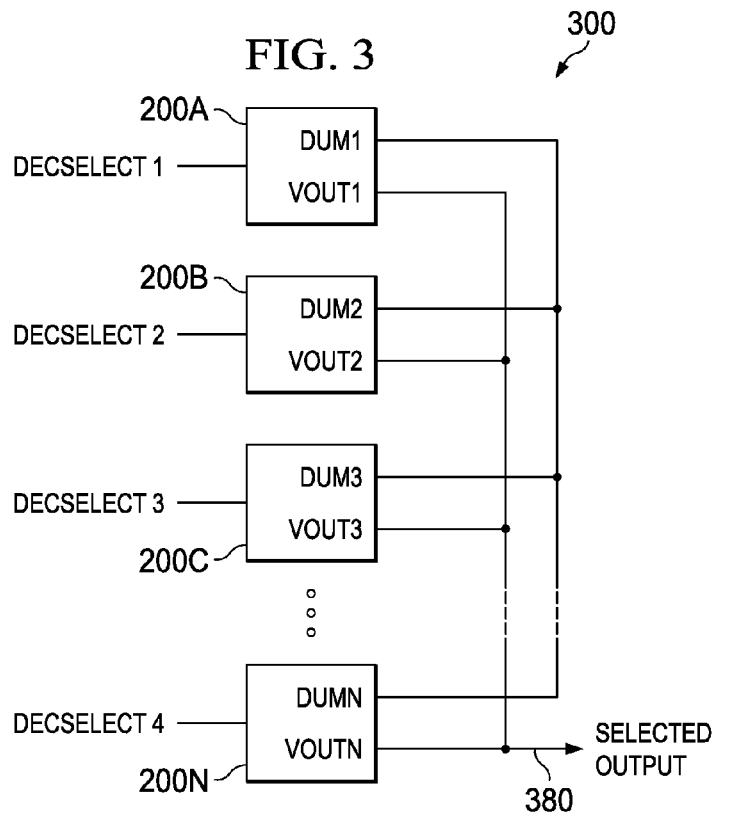
FIG. 3 is a block diagram of an example embodiment of a multiplexer with multiple multiplexer channels of FIG. 2.

FIG. 3 provides a block diagram of multiplexer 300. Multiplexer block diagram 300 provides multiple instances of multiplexing channel 200 from FIG. 2. Multiplexer 300 may include multiplexing channel 200A, multiplexing channel 200B, multiplexing channel 200C, through multiplexing channel 200N. Each multiplexing channel may include a decoder select line to pass the input of that multiplexing channel to the output. To pass the input of multiplexing channel 200A to the output, DECSELECT1 is selected. To pass the input of multiplexing channel 200B to the output, DECSELECT2 is selected. To pass the input of multiplexing channel 200C to the output, DECSELECT3 is selected. To pass the input of multiplexing channel 200N to the output, DECSELECT4 is selected. There may also be optional PULSEOFF1 down to PULSEOFFN lines and PULSEON1 down to PULSEONN lines. In this example embodiment, the dummy lines are not connected to an output. In an alternative embodiment, the dummy lines may be connected to an output of the device, for example.

Figure 4:
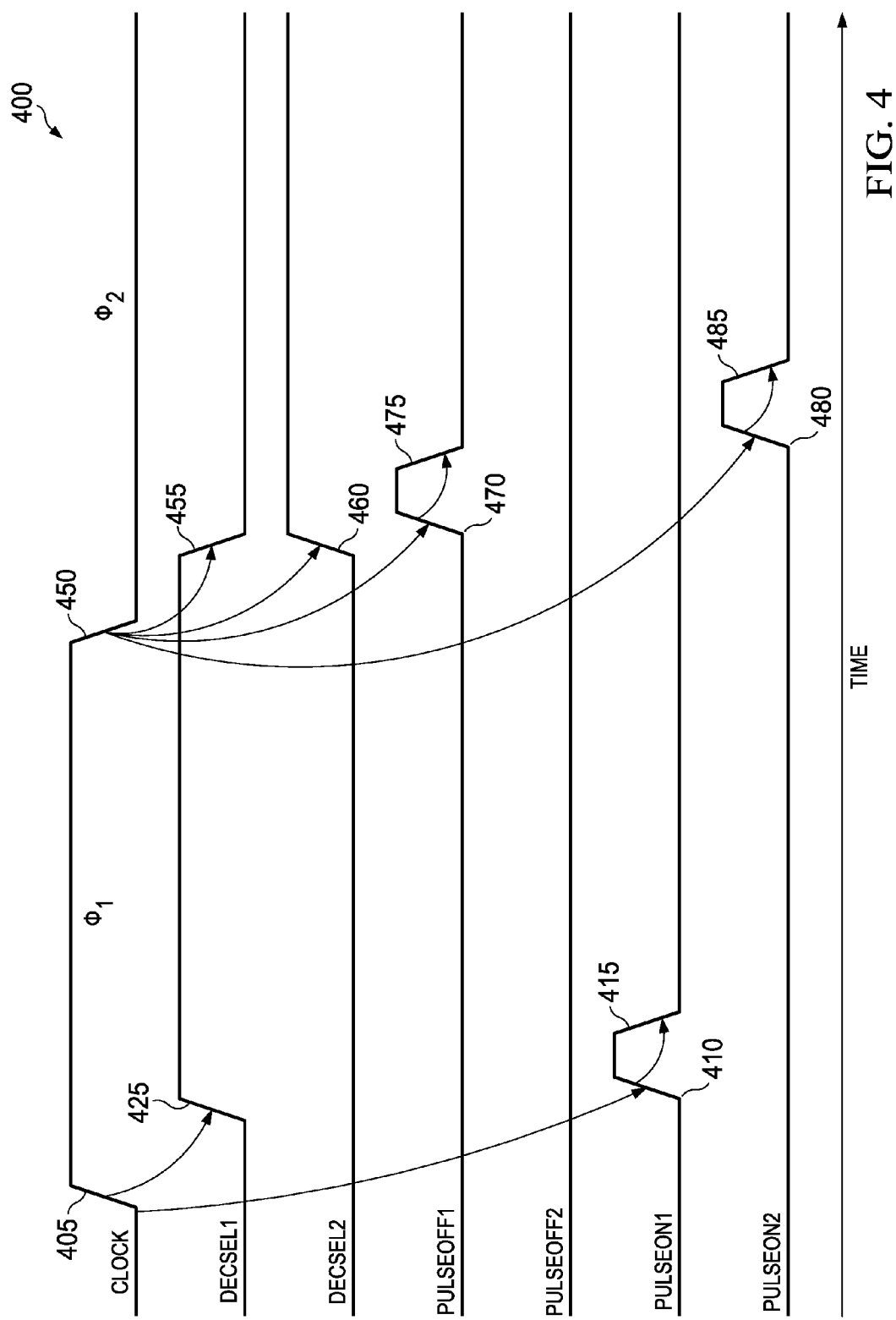
FIG. 4 is a timing diagram of an example embodiment of the multiplexer of FIG. 2.

FIG. 4 provides an example embodiment of timing control diagram 400. This example embodiment of timing control diagram 400 provides the timing relationships between a clock, the select lines (DECSELECT1 and DECSELECT2) and the pulse-on and pulse-off lines (PULSEOFF1, PULSEOFF2, PULSEON1, and PULSEON2). In example embodiments, the pulse-on and pulse-off signals can be generated with a clock or with the DECSELECT signal. In the first phase of the clock, the clock is high at transition 405. With clock high, when DECSELECT1 goes high at transition 425, PULSEON1 goes high at transition 410 for a short time, and goes low at transition 415. The clock enters a second phase when clock goes low at transition 450. When clock goes low, DECSELECT1 goes low at transition 455, and DECSELECT2 goes high at transition 460, PULSEOFF1 pulses on at transition 470 and off at transition 475. PULSEON1 starts after PULSEOFF1 ends (475). This avoids temporary contention between the multiplexer ports. PULSEON2 pulses on at transition 480 and off at transition 485.

Figure 5:
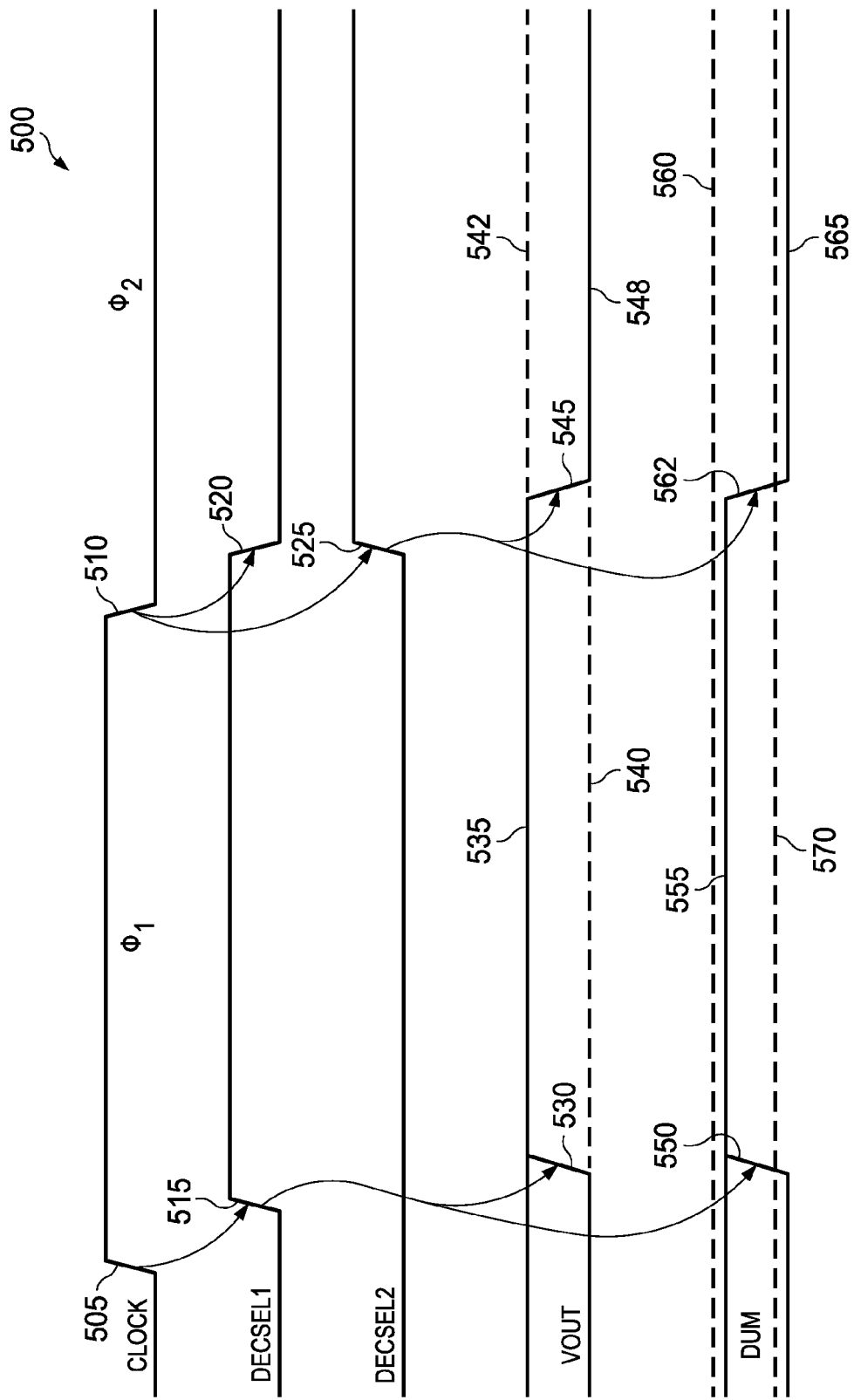
FIG. 5 is a timing diagram of an example embodiment of the multiplexer of FIG. 2.

FIG. 5 provides an example embodiment of timing control diagram 500. This example embodiment of timing control diagram 500 provides timing relationships and voltage levels of VOUT (the output voltage) and DUM (a dummy voltage output). In phase one of the clock, the clock signal goes high at transition 505. When DECSEL1 goes high at transition 515, the input is reflected to VOUT at transition 530 and to DUM, the dummy voltage, at transition 550. When DECSEL1 goes low at transition 520, VOUT goes low at transition 545, and DUM goes low at transition 562. As DECSEL1 goes low at transition 520, DECSEL2 goes high at transition 525. When DECSEL1 is active, Vout is a substantially accurate representation of the input voltage. The input voltage is represented by the dashed line. DUM has an offset. The offset is the result of current passing through the dummy pass gate, caused by the on-state drain to source resistance. The dummy pass device sets up a bias $V_{GS}$ for the actual pass device.

The input voltage level is at low level 540 and high level 542 on the VOUT line and at low level 570 and high level 560 on the DUM line. Dummy line output voltages 555 and 565 do not match input voltages 560 and 570. There is an offset related to the drop across the parasitic resistance of the dummy pass transistors. However, on VOUT, output voltages 535 and 548 substantially match input voltages 542 and 540.

FIG. 6 provides a circuit diagram of an example application using an example embodiment of the disclosed systems for accurate multiplexing. Circuit 600 includes analog to digital converter (ADC) 660 with multiplexer 620 and 630. In this example application, ADC 660 is a differential ADC, but the ADC could also be single ended. ADC 660 is used to measure voltages on battery pack 605. The cells of battery pack 605 are connected to positive multiplexer 620 and negative multiplexer 630 to measure cell voltages. Multiplexer 620 is electrically connected to the positive input of ADC 660 through capacitor 640 and multiplexer 630 is electrically connected to the negative input of ADC 660 through capacitor 650.

The disclosed embodiments are shown as used in a multiplexer. The structure is bidirectional and could be used as a de-multiplexer as well. In a de-multiplexer embodiment, the analog input signal may be applied to both the VOUT and DUM lines.

Therefore, at least the following is claimed:

1. An apparatus comprising:
   a plurality of input terminals;
   a plurality of select terminals;
   an output terminal;
   a dummy terminal; and
   a plurality of switching circuits, wherein each switching circuit is coupled to an associated input terminal, an associated select terminal, the dummy terminal, and the output terminal, and wherein each switching circuit includes:
      a first pass gate having:
         a first PMOS transistor having a source electrode, a drain electrode, a control electrode, and a body electrode, wherein the drain electrode of the first transistor is coupled to the associated input terminal; and
         a second PMOS transistor having a source electrode, a drain electrode, a control electrode, and a body electrode, wherein the drain electrode of the second PMOS transistor is coupled to the dummy terminal;
         wherein the respective source electrodes of the PMOS transistors are connected;
         wherein respective body electrodes of the PMOS transistors are connected;
         wherein respective control electrodes of the PMOS transistors are connected to a first control input; and
         wherein respective drains of the PMOS transistors are extended drains:
      a second pass gate that is coupled between the associated input terminal and the output terminal, wherein the second pass gate includes a second control input;
      a loading circuit that is coupled between a first node and a second node
         the first node coupled to the respective connected source electrodes, and the respective connected bode electrodes, of the first and second PMOS transistors and
         the second node coupled to the first and second control inputs:
      a pulsing circuit that is coupled between the first and second nodes, in parallel with the loading circuit:
      a selection circuit that is coupled to the second node and to the associated select terminal, wherein each switching circuit is controlled by a select signal applied to the associated select terminal, wherein the select signal includes a select-active duration defined by a turn-on edge and a turn-off edge,
      wherein the pulsing circuit further comprises:
         a current mirror coupled between the first and second nodes in parallel to the loading circuit; and
         a pulse-off control transistor that is coupled to the current mirror and that is configured to receive a pulse-off signal at its gate, wherein the pulse-off signal is timed in relation to the turn-off edge of the select signal, and with a pulse-active duration substantially shorter that the select duration; and
         a current source that is coupled to the pulse-off control transistor.

2. The apparatus of claim 1, wherein the current source further comprises a first current source; and wherein the selection circuit further comprises:
   a selection transistor that is coupled to the second node, and that includes a control electrode coupled to the select terminal; and
   a second current source that is coupled to the selection transistor.

3. The apparatus of claim 1, wherein the pulsing circuit further comprises a pulse-on control transistor that is coupled to the second node, and that is configured to receive a pulse-on signal at its gate, wherein the pulse-on signal is timed in relation to the turn-on edge of the select signal, with a pulse-active duration that is substantially shorter than the select-active duration.

4. An apparatus comprising:
   an analog-to-digital converter (ADC);
   a plurality of multiplexers, wherein each multiplexer includes:
      a plurality of input terminals;
      a plurality of select terminals;
      an output terminal that is coupled to the ADC;
      a dummy terminal; and
      a plurality of switching circuits, wherein each switching circuit is coupled to an associated input terminal, an associated input terminal, the dummy terminal, and the output terminal, and wherein each switching circuit includes:
         a first pass gate having:
            a first PMOS transistor that is coupled to an associated input terminal at its drain; and
            a second PMOS transistor that is coupled to an associated dummy terminal at its drain;
            wherein the respective source electrodes of the PMOS transistors are connected;
            wherein respective body control electrodes of the PMOS transistors are connected;
            wherein respective control electrodes of the PMOS transistors are connected to a first control input; and
            wherein the drains of the PMOS transistors are extended drains;
         a second pass gate that is coupled between the associated input terminal and the output terminal, wherein the second pass gate includes a second control input;
         a loading circuit that is coupled between a first and a second node,
            the first node coupled to the respective connected source electrodes and respective connected body electrodes of the first and second PMOS transistors, and
            the second node coupled to the first and second control inputs;
         a pulsing circuit that is coupled between the first and second nodes, in parallel to the loading circuit;
         a selection circuit that is coupled to the second node, wherein each switching circuit is controlled by a select signal applied to its select terminal, wherein the select signal includes a select-active duration defined by a turn-on edge and a turn-off edge;
         wherein the pulsing circuit is configured to generate a pulse-off signal timed in relation to the turn-off edge of the select signal, and with a pulse-active duration substantially shorter that the select-active duration.

5. The apparatus of claim 4, wherein the pulsing circuit further comprises:
   a current mirror coupled between the first and second nodes in parallel to the loading circuit;

wherein the current mirror includes PMOS transistors;
an NMOS transistor that is coupled to the current mirror at its drain and that receives the pulse-off signal at its gate; and
a current source that is coupled to the source of the NMOS transistor.

6. The apparatus of claim 5, wherein the NMOS transistor further comprises a first NMOS transistor, and wherein the current source further comprises a first current source; and wherein the selection circuit further comprises:
   a second NMOS transistor that is coupled to the second node at its drain; and
   a second current source that is coupled to the source of the second NMOS transistor.

7. The apparatus of claim 4 wherein the pulsing circuit further comprises a pulse-on control circuit that is coupled to the second node, and that is configured to generate a pulse-on signal timed in relation to the turn-on edge of the select signal, with a pulse-active duration that is substantially shorter than the select-active duration.

8. The apparatus of claim 7, wherein the pulse-on circuit further comprises:
   a third NMOS transistor that is coupled to the second node at its drain; and
   a third current source that is coupled to the source of the third NMOS transistor.

9. The apparatus of claim 4, wherein each input terminal from each multiplexer is coupled to a battery stack.

\* \* \* \* \*